United States Patent [19]

Yeh

[11] Patent Number: 5,766,031

[45] Date of Patent: Jun. 16, 1998

[54] ELECTRICAL CONNECTOR WITH FASTENERS

[76] Inventor: Te-Hsin Yeh, No. 45, Tung Yuan Road, Chungli, Taoyuan County, Taiwan

[21] Appl. No.: 763,892

[22] Filed: Dec. 11, 1996

[51] Int. Cl.[6] .................................................. H01R 13/62
[52] U.S. Cl. .......................................... 439/328; 439/157
[58] Field of Search ................................ 439/152–160, 439/326–328

[56] References Cited

U.S. PATENT DOCUMENTS

| 5,372,518 | 12/1994 | Liu et al. | 439/326 |
| 5,389,000 | 2/1995 | DiViesti et al. | 439/157 |
| 5,443,394 | 8/1995 | Billman et al. | 439/157 |
| 5,637,004 | 6/1997 | Chen et al. | 439/328 X |

Primary Examiner—Khiem Nguyen
Attorney, Agent, or Firm—Thomas R. Vigil

[57] ABSTRACT

An electrical connector with fasteners includes an electrical connector body and two fasteners respectively pivotally disposed at the end of the electrical connector body. The fasteners each has a fastener body having a locking rim and an urging rim respectively at the upper edge and lower edge of its inner side. When a CPU module is inserted into an insert slot of the electrical connector body, a lateral bottom edge of the CPU module may urge against the urging rim so that the locking rim turns and engages a retain slot of the CPU module to firmly lock the CPU module in place. The electrical connector body is provided with a recess of a relatively large space for the movement of the inner bottom side of the fastener body. Both sides of the bottom of the urging rim of the fastener body are respectively provided with two stop blocks each having a slanting surface and an upright wall surface. By means of the slanting surfaces and the upright wall surfaces of the stop blocks of the urging rim, the fastener body may contact the inner side walls and outer side walls of the recess to permit the fastener body to slant outwardly to facilitate the insertion of the CPU module or to stand upright to lock the CPU module firmly in place.

1 Claim, 4 Drawing Sheets

ELECTRICAL CONNECTOR WITH FASTENERS

BACKGROUND OF THE INVENTION (a) Field of the Invention

The present invention relates generally to an electrical connector with fasteners, and more particularly to an improved electrical connector having a simple construction and capable of firmly locking a CPU module in the electrical connector.

(b) Description of the Prior Art

In most conventional electrical connectors, the chip units are held in the electrical connectors by means of the terminals of the electrical connectors. If the CPU module is small, this method may provide a good locking effect. But when the CPU module is large, such a method cannot provide good securing effect.

There has been developed an electrical connector with a pull piece at either end of the electrical connector. The pull pieces may be operated to allow insertion or removal of the CPU module into or from the electrical connector. There are also provided stop blocks at the outer sides of the pull pieces for restricting the angle of rotation of the pull pieces. Such a design is not only unsightly, the stop blocks may also destroy the structure if they are not properly arranged, thus affecting the limitation they impose on the rotational angles of the pull pieces. Worse still, the inner bottom sides of the pull pieces may break or crack if the force inserted upon the pull pieces cannot be controlled.

SUMMARY OF THE INVENTION

Accordingly, a primary object of the present invention is to provide an electrical connector with fasteners in which the fasteners are each provided with an urging bottom rim and a locking top rim to permit easy insertion or removal of a CPU module into or from the electrical connector, the urging bottom rim further having a stop block at either side of a bottom side thereof, the stop block having a slanting surface and an upright wall surface such that the slanting surface may urge against a corresponding inner side of the electrical connector to effectively restrict the slanting angle of the fastener when the fastener turns outwardly so as to facilitate the insertion of the CPU module into the electrical connector.

BRIEF DESCRIPTION OF THE DRAWINGS

The foregoing and other features and advantages of the present invention will be more clearly understood from the following detailed description and the accompanying drawings, in which.

DETAILED DESCRIPTION OF THE PREFERRED EMBODIMENT

Figure 1:
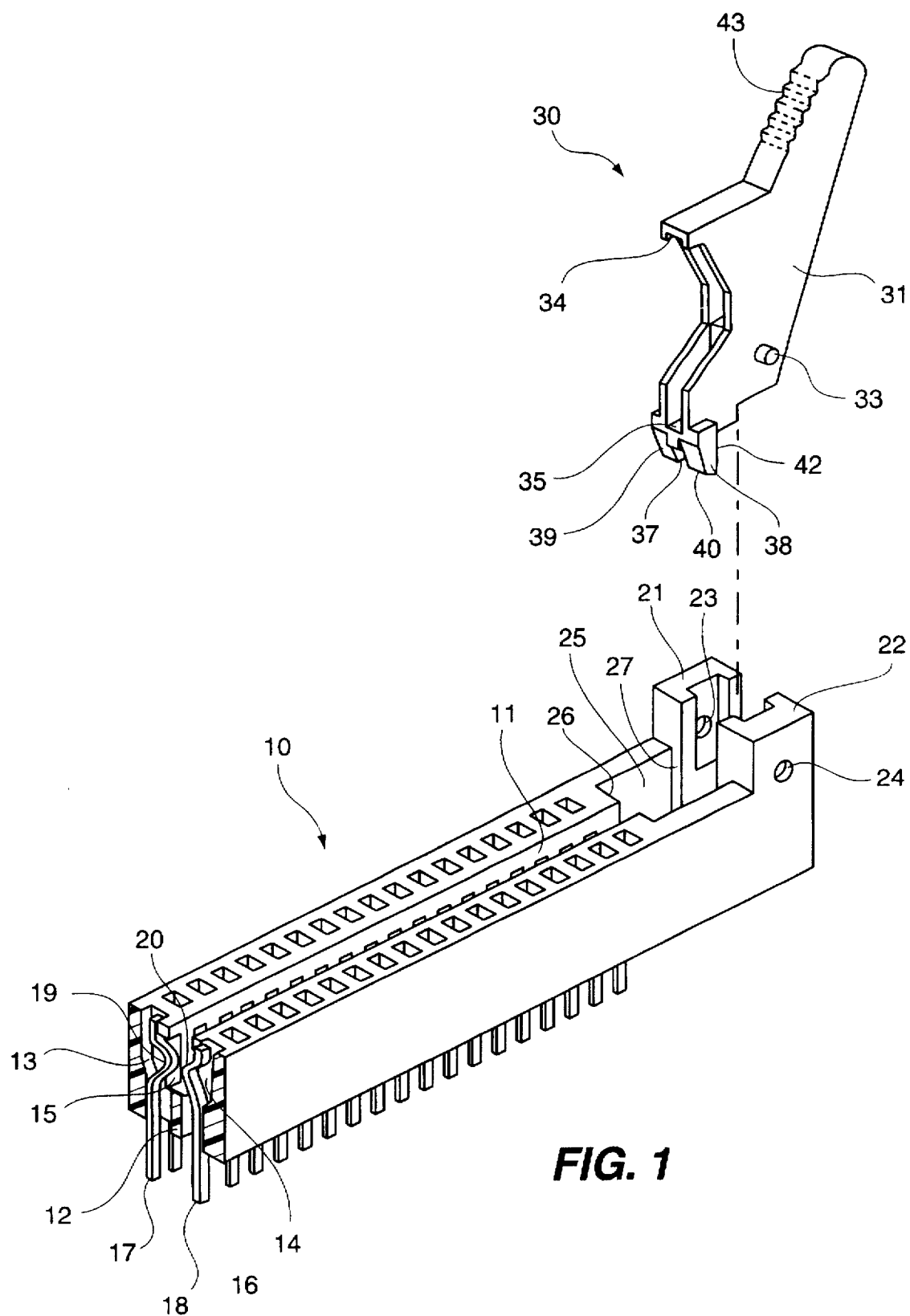
FIG. 1 is an elevational exploded view of one side of the electrical connector of the present invention.
Figure 2:
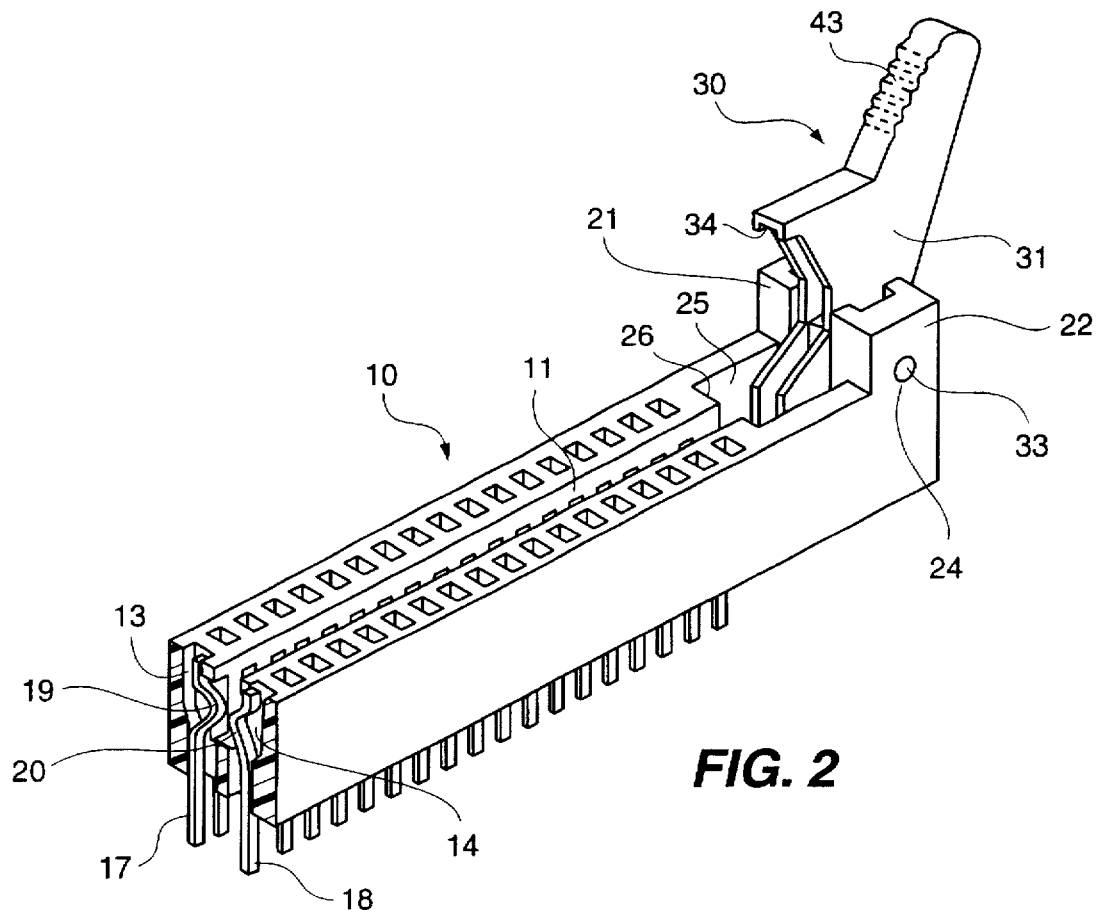
FIG. 2 is an elevational assembled view of one side of the electrical connector of the present invention.
Figure 3:
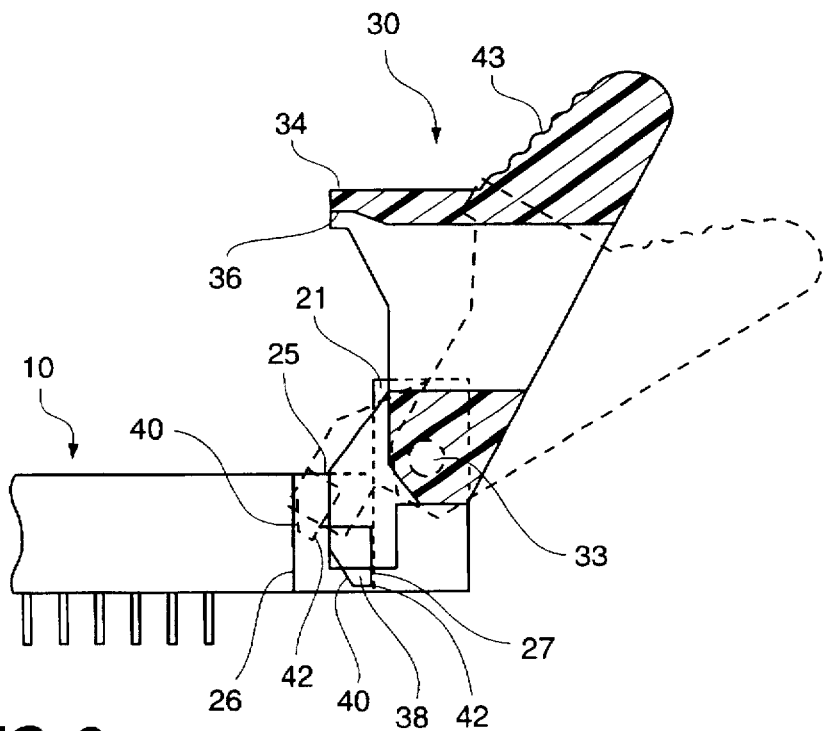
FIG. 3 is a schematic view showing the coupling of the fasteners and the electrical connector body of the electrical connector of the present invention.

With reference to FIGS. 1-3, the electrical connector with fasteners disclosed in the present invention essentially comprises an electrical connector body 10 and two fasteners 30 respectively pivotally disposed at the ends of the electrical connector body 10. The electrical connector body 10 is a rod-like structure having a substantially rectangular cross section. In addition to having a longitudinal insert slot 11 at an upper part thereof for insertion of a CPU module 50, the electrical connector body 10 has a longitudinally oriented partition plate 12 extending from right below the insert slot 11 downwardly to a bottom end, so that the electrical connector body 10 is divided into a left side and a right side due to the arrangement of the insert slot 11 and the partition plate 12. Additionally, the left and right sides of the electrical connector body 10 are respectively provided with a plurality of corresponding terminal securing slots 13, 14 penetrating from the bottom of the electrical connector body 10 to the top thereof. These terminal securing slots 13, 14 are respectively provided with openings 15, 16 communicating with the insert slot 11, so that when each terminal 17 or 18 has its upper half section fit into the terminal securing slot 13 or 14 from a bottom end of the terminal securing slot 13 or 14, a protrudent contact 19 or 20 formed at the upper half section of the terminal 17 or 18 may extend into the insert slot 11 via the opening 15 or 16 so as to provide a connection between the terminal 17 or 18 and a contact surface (not shown) of the CPU module 50. The two ends of the electrical connector body 10 are respectively provided with two corresponding side walls 21, 22 which extend upwardly to a suitable extent. The side walls 21, 22 are respectively provided with a corresponding pivot hole 23, 24 at suitable positions. A recess 25 of a larger space is further provided at the inner sides of the side walls 21 and 22.

Each fastener 30 is formed by a suitably shaped fastener body 31. Two pivots 32, 33 are respectively disposed at the two sides of the fastener body 31 for insertion into the corresponding pivot holes 23, 24 at the side walls 21, 22 provided at the ends of the electrical connector body 10, so that the fasteners 30 may be pivotally disposed at the ends of the electrical connector body 10. An upper edge and a lower edge of the inner side of the fastener body 31 are respectively provided with a locking top rim 34 and an urging bottom rim 35. As shown in FIG. 3, the locking top rim 34 has a suitable thickness and an outer edge of its bottom is configured to form a curved surface 36. An outer edge of the urging bottom rim 35, on the other end, is substantially vertically flushed with the outer rim of the locking top rim 34. In addition, both sides of the bottom of the urging bottom rim 35 are respectively provided with an outwardly projecting stop block 37, 38. Each stop block 37, 38 has an inclined surface 39, 40 formed at an outer side thereof, the inclined surface 39, 40 inclining to an inner side of the stop block 37, 38 to a suitable extent. The inner side of the stop block 37, 38, on the other hand, forms an upright wall surface 41, 42. In addition, when the fasteners 30 are respectively pivotally connected tot the two ends of the electrical connector body 10, the two stop blocks 37 and 38 may just fit into the recess 25 of the electrical connector body 10, so that the fasteners 30 may, by means of the inclined surfaces 39 and 40 and the upright wall surfaces 41 and 42 of the respective stop blocks 37 and 38, contact an inner side wall 26 and an outer side wall 27 of the recess 25, thereby the fasteners 30 may incline outwardly at a specific angle or stand upright in a locking state. Furthermore, an upper edge of the outer side of each fastener 31 is provided with a slanting pull portion 43.

Figure 4:
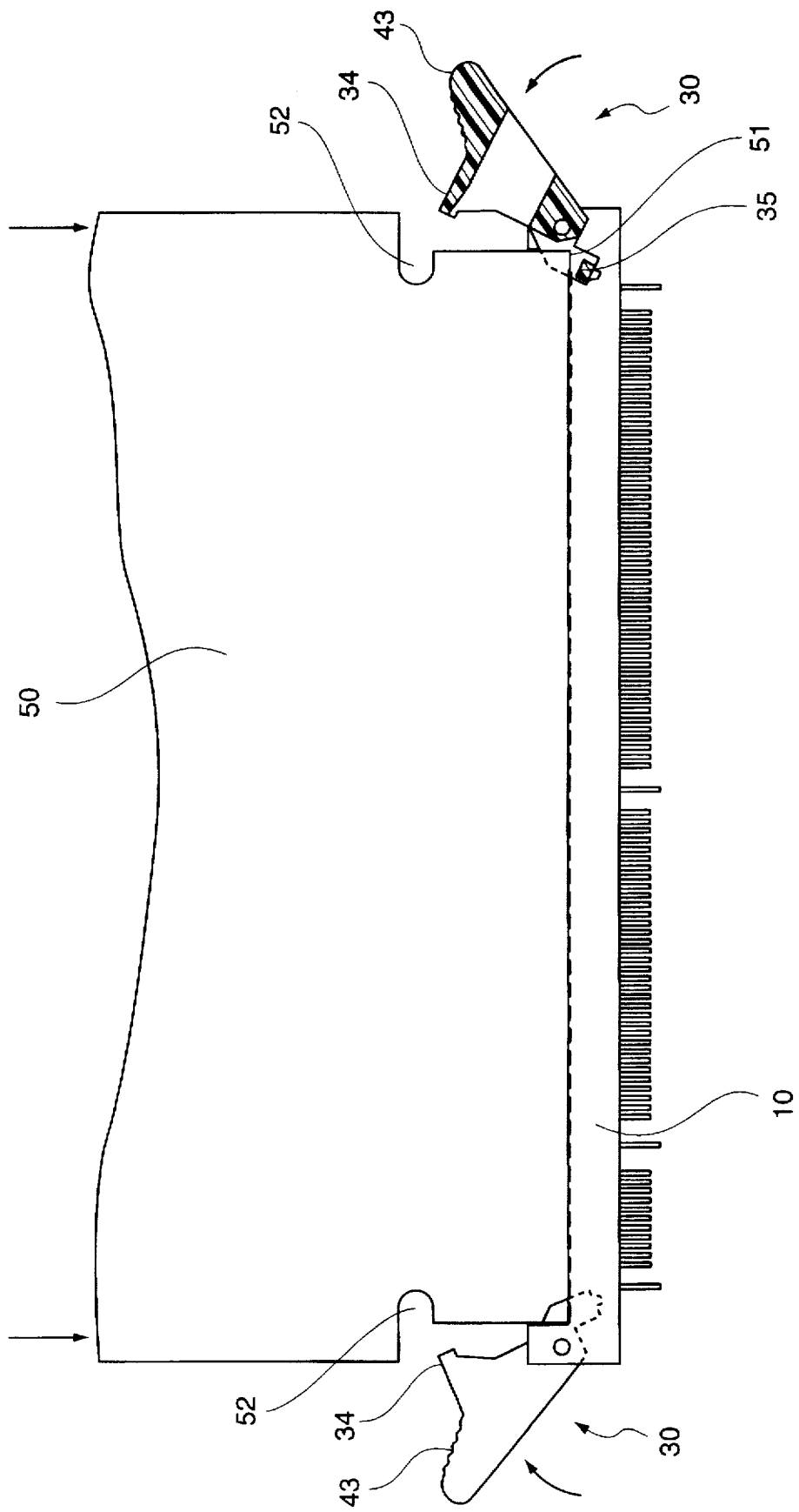
FIG. 4 is a schematic view illustrating a CPU module inserted in the electrical connector of the present invention.
Figure 5:
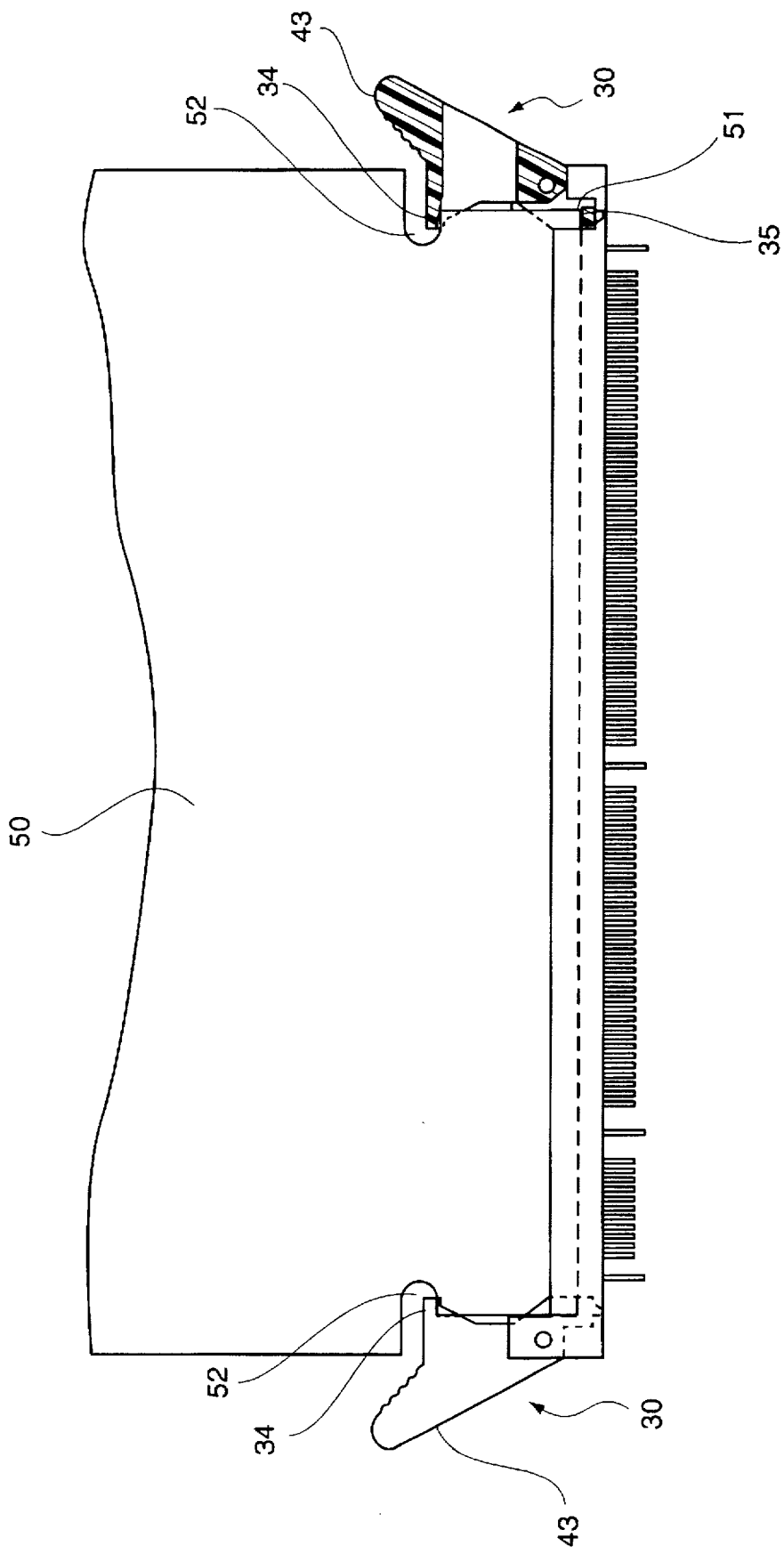
FIG. 5 is a schematic view illustrating the CPU module secured in the electrical connector of the present invention.

The operation of the present invention is illustrated in FIGS. 4 and 5. When the CPU module 50 is inserted with its bottom edge into the insert slot 11 of the electrical connector body 10, a lateral bottom rim 51 thereof may just urge against the urging bottom rim 35 of the fastener body 31 so that the locking top rim 34 of the fastener body 31 turns and engages a retain slot 52 of the CPU module 50 to achieve securing of the CPU module 50 in the electrical connector body 10. On the contrary, if it is intended to plug out the CPU module 50 from the electrical connector body 10, it is only necessary to pull the pull portion 43 of the fastener 30 so that the retain slot 52 of the CPU module 50 disengages from the locking top rim 34 and the CPU module 50 is pushed upwardly by the urging bottom rim 35 to disengage from the insert slot 11 of the electrical connector body 10.

In summary, the the fasteners according to the present invention are provided with stop blocks respectively having a suitably slanting surface and an upright wall surface at their bottom, and the stop blocks are accommodated in the recess correspondingly provided in the electrical connector body. By means of the slanting surface and the upright wall surface urging against the inner side wall and the outer side wall of the recess, the fasteners may slant at specific angles to facilitate the plugging in of the CPU module or stand upright in a locking state to achieve firm locking of the CPU module in the electrical connector body.

Although the present invention has been illustrated and described with reference to the preferred embodiment thereof, it should be understood that it is in no way limited to the details of such embodiment but is capable of numerous modifications within the scope of the appended claims.

What is claimed is:

1. An electrical connector with fasteners comprising an electrical connector body and two fasteners respectively pivotally provided at the two ends of said electrical connector body, wherein said electrical connector body is a rod-like structure having a substantially rectangular cross section and being provided with a longitudinal insert slot at an upper part thereof for insertion of a CPU module, said electrical connector body having a longitudinally oriented partition plate extending from right below said insert slot downwardly to a bottom end, so that said electrical connector body is divided into a left side and a right side due to the arrangement of said insert slot and said partition plate; the left and right sides of said electrical connector body being respectively provided with a plurality of corresponding terminal securing slots penetrating from the bottom of said electrical connector body to the top thereof, said terminal securing slots being respectively provided with openings communicating with said insert slot so that when each terminal has its upper half section fit into said terminal securing slot from a bottom end of said terminal securing slot, a protrudent contact formed at the upper half section of said terminal may extend into said insert slot via said openings so as to provide a connection between said terminal and a contact surface of said CPU module; the two ends of said electrical connector body being respectively provided with two corresponding side walls which extend upwardly to a suitable extent; said side walls being each provided with a corresponding pivot hole at a suitable position; and said fasteners are each formed by a suitably shaped fastener body, said fastener body having a pivot at either side thereof for insertion into the corresponding pivot holes at said side walls at the ends of said electrical connector body so that said fasteners may be pivotally disposed at the ends of said electrical connector body; an upper edge and a lower edge of the inner side of said fastener body being respectively provided with a locking top rim and an urging bottom rim so that when said CPU module is inserted with its bottom edge into said insert slot of said electrical connector body, a lateral bottom edge thereof may urge against said urging bottom rim of said fastener body so that said locking top rim of said fastener body may turn and engage a retain slot of said CPU module; an upper edge of the outer side of said fastener being provided with a slanting pull portion whereby when said pull portion is pulled, said CPU module may be released from the engagement of said locking top rim and said CPU module may be pushed upwardly by said urging bottom rim to disengage from said insert slot of said electrical connector body, characterized in that said electrical connector has a recess of a relatively large space disposed at the inner sides of said side walls at the ends thereof to serve as a space for the movement of the bottom portions of the inner sides of said fasteners, and that a stop block having a slanting surface and an upright wall surface is disposed at either side of the bottom of said urging bottom rim of said fastener body, whereby said fasteners may, by means of said slanting surfaces and upright wall surfaces of said stop blocks, contact the inner side walls and outer side walls of said recess of said electrical connector body so as to restrict the slanting angle of said fasteners to facilitate insertion of said CPU module into said electrical connector body or to stand upright to firmly lock said CPU module in place.

* * * * *